(12) United States Patent
Chaji et al.

(10) Patent No.: US 12,408,480 B2
(45) Date of Patent: Sep. 2, 2025

(54) MICRODEVICE CARTRIDGE STRUCTURE

(71) Applicant: VueReal Inc., Waterloo (CA)

(72) Inventors: Gholamreza Chaji, Waterloo (CA); Ehsanollah Fathi, Waterloo (CA); Pranav Gavirneni, Kitchener (CA); Bahareh Sadeghimakki, Kitchener (CA); Wissal Mahdi Alayashi, Waterloo (CA)

(73) Assignee: VueReal Inc., Waterloo (CA)

( * ) Notice: Subject to any disclaimer, the term of this patent is extended or adjusted under 35 U.S.C. 154(b) by 685 days.

(21) Appl. No.: 17/432,432

(22) PCT Filed: Feb. 22, 2020

(86) PCT No.: PCT/IB2020/051501
§ 371 (c)(1),
(2) Date: Aug. 19, 2021

(87) PCT Pub. No.: WO2020/170219
PCT Pub. Date: Aug. 27, 2020

(65) Prior Publication Data
US 2022/0149231 A1  May 12, 2022

Related U.S. Application Data

(60) Provisional application No. 62/931,023, filed on Nov. 5, 2019, provisional application No. 62/894,409, filed
(Continued)

(51) Int. Cl.
*H01L 21/66* (2006.01)
*H01L 25/075* (2006.01)
(Continued)

(52) U.S. Cl.
CPC ............. *H10H 20/01* (2025.01); *H01L 22/32* (2013.01); *H01L 25/0753* (2013.01);
(Continued)

(58) Field of Classification Search
CPC . H01L 33/0095; H01L 22/32; H01L 25/0753; H01L 33/0093; H01L 33/62;
(Continued)

(56) References Cited

U.S. PATENT DOCUMENTS 5,981,302 A * 11/1999 Alswede ................. H01L 22/32
438/18
8,518,204 B2 * 8/2013 Hu .......................... H01L 24/83
156/273.1

(Continued)

FOREIGN PATENT DOCUMENTS

CN    109075119 A    12/2018
CN    110957342 A    4/2020
(Continued)

OTHER PUBLICATIONS

International Searching Authority, PCT Written Opinion of the International Search Authority and International Search Report, dated May 22, 2020.
(Continued)

*Primary Examiner* — Christopher A Johnson

(57) ABSTRACT

What is disclosed structures and methods of integrating micro devices into system substrate.

10 Claims, 14 Drawing Sheets

Related U.S. Application Data on Aug. 30, 2019, provisional application No. 62/809,161, filed on Feb. 22, 2019.

(51) Int. Cl.
*H10H 20/01* (2025.01)
*H10H 20/857* (2025.01)

(52) U.S. Cl.
CPC ........ *H10H 20/018* (2025.01); *H10H 20/857* (2025.01); *H10H 20/0364* (2025.01)

(58) Field of Classification Search
CPC ... H01L 2933/0066; H01L 2221/68322; H01L 21/6835; H01L 27/153; H01L 2221/68368; H01L 2221/68381; H01L 22/34; H01L 33/483
See application file for complete search history.

(56) References Cited

U.S. PATENT DOCUMENTS

| | | | |
|---|---|---|---|
| 9,490,276 B2 * | 11/2016 | Kim | .................. H01L 27/1222 |
| 2007/0070311 A1 * | 3/2007 | Bijnen | .................. G03F 9/7084 |
| | | | 257/E23.179 |
| 2013/0130440 A1 | 5/2013 | Hu et al. | |
| 2014/0340900 A1 | 11/2014 | Bathurst et al. | |
| 2015/0327388 A1 | 11/2015 | Menard et al. | |
| 2016/0218143 A1 | 7/2016 | Chaji et al. | |
| 2017/0122502 A1 | 5/2017 | Cok et al. | |
| 2017/0278733 A1 | 9/2017 | Chang et al. | |
| 2018/0151804 A1 | 5/2018 | Chaji et al. | |
| 2019/0080970 A1 | 3/2019 | Chaji | |
| 2019/0096774 A1 * | 3/2019 | Chaji | ..................... H01L 33/08 |
| 2021/0202572 A1 | 7/2021 | Chaji et al. | |

FOREIGN PATENT DOCUMENTS

| | | |
|---|---|---|
| CN | 111129235 A | 4/2020 |
| CN | 111128789 A | 5/2020 |
| KR | 20190097062 A | 8/2019 |
| TW | 201705532 A | 2/2017 |
| WO | 2018096455 A1 | 5/2018 |

OTHER PUBLICATIONS

KIPO: KR Office Action relating to KR application No. 10-2021-7030214, dated Oct. 28, 2024.
CNIPA: CN Office Action relating to CN application No. 202080015087.3, dated Feb. 22, 2025.
ROC (Taiwan): TW Office Action relating to TW application No. 110129061, dated Apr. 8, 2025.
KIPO: KR Office Action relating to KR application No. 10-2023-7004486, dated May 14, 2025.

* cited by examiner

MICRODEVICE CARTRIDGE STRUCTURE

FIELD OF THE INVENTION

The present disclosure relates to the integration of micro devices into system substrate.

BRIEF SUMMARY

The present invention relates to a method of integrating micro devices on a backplane that comprises of providing a micro device substrate comprising one or more micro devices, bonding a
selective set of the micro devices from the substrate to the backplane by connecting pads on the micro devices and corresponding pads on the backplane, and leaving the bonded selective set of micro devices on the backplane by separating the micro device substrate.

Another embodiment of the present inventions relates to a method of integrating micro devices on a backplane that comprises of providing a micro device substrate comprising one or more micro devices, bonding a selective set of the micro devices from the substrate to the backplane by connecting pads on the micro devices and corresponding pads on the backplane, and leaving the bonded selective set of micro devices on the backplane by separating the micro device substrate.

Another embodiment of the present inventions relates to a method of integrating microdevices to a system substrate that comprises of integrating a first microdevice on a surface of the system substrate, providing a cartridge substrate comprising one or more second microdevice, and integrating the at least one second microdevice on the surface of the system substrate, wherein an interfering area between the second and first microdevices is eliminated by having different sizes of the first and the second micro devices.

BRIEF DESCRIPTION OF THE DRAWINGS

The foregoing and other advantages of the disclosure will become apparent upon reading the following detailed description and upon reference to the drawings.

Figure 1A:
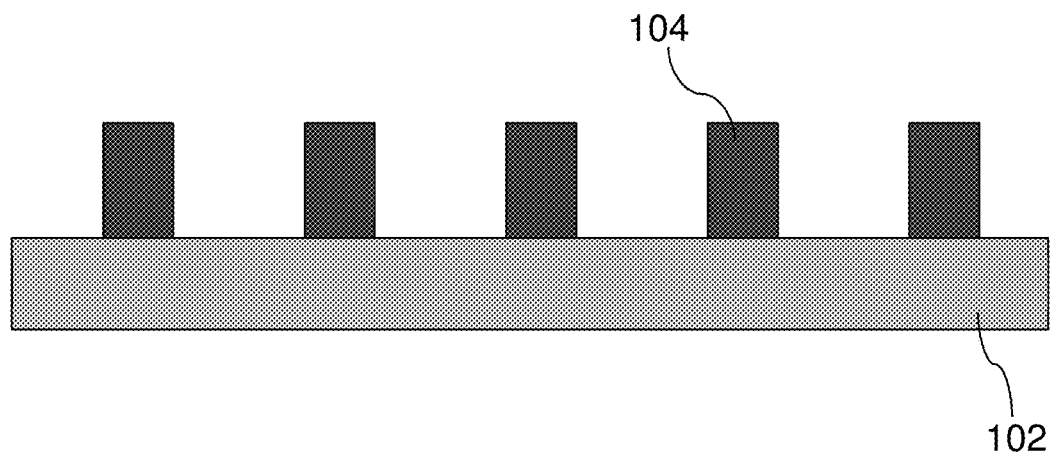
FIG. 1A shows a cross section view of a micro device array on a micro device substrate, according to one embodiment of the present invention.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

In this description, the terms "device" and "micro device" are used interchangeably. However, it is clear to one skilled in the art that the embodiments described here are independent of the device size.

A few embodiments of this description are related to integration micro-devices into a receiving substrate. The system substrate may comprise micro light emitting diodes (LEDs), Organic LEDs, sensors, solid state devices, integrated circuits, (micro-electro-mechanical systems) MEMS, and/or other electronic components.

The receiving substrate may be, but is not limited to, a printed circuit board (PCB), thin film transistor backplane, integrated circuit substrate, or, in one case of optical micro devices such as LEDs, a component of a display, for example a driving circuitry backplane. The patterning of micro device donor substrate and receiving substrate can be used in combination with different transfer technology including but not limited to pick and place with different mechanisms (e.g. electrostatic transfer head, elastomer transfer head), or direct transfer mechanism such as dual function pads and more).

In one embodiment, an array of micro devices may be developed on a micro device substrate, wherein the micro devices may be developed by etching of planar layers.

In another embodiment, a buffer layer is deposited on or over the array of micro devices. The buffer layer may be extended over the surface of the micro device substrate.

In some embodiments, one or more planarization layers may be formed on the micro device substrate and cured by one of: temperature, light or other sources.

In one embodiment, an intermediate substrate may be provided. In one case, bonding layers may be formed either on the intermediate substrate or over the planarization layers.

In another embodiment, the micro device substrate may be removed by laser or chemical liftoff.

In one embodiment, there may be an opening in the buffer layer that allows the micro devices to be connected to the planarization layer. In one case, an electrode may be provided on top or bottom of the planarization layer.

In another embodiment, after the micro device substrate is removed, extra process may be done. These processes comprises one of: removing extra common layers, thinning the planarization layer and or the microdevice.

In one case, one or more pads may be added to the microdevices. The pads may be electrically conductive or purely for bonding to a system substrate. In one case, the buffer layer may connect at least one micro device to a test pad. The test pad may be used to bias the micro device and test its functionality. The test may be done at wafer level or at the intermediate (cartridge) level. The pad may be accessible at the intermediate (cartridge) level after removing the excess layers.

In case of the microdevice has more than one contact at the top side, the buffer layer may be patterned to connect the contacts of at least one of the the microdevice to the test pads.

In another embodiment, a backplane may be provided. In one case, a backplane may have transistors and other elements for a pixel circuit to drive the microdevice. In another case, backplane may be a substrate with no component.

In one embodiment, one or more pads may be provided on the backplane for bonding. In one case, the pads on the backplane or the pads on micro devices may create force to poll out the selected microdevices.

In another embodiment, after transferring the microdevices to the backplane, it is possible to detect the location/position of micro devices and adjust the patterning for other layers to match the misalignment in the transfer. In one case, different means may be used to detect the location of a micro device such as camera, probe tips, and etc. In another case, an offset in the transfer setup may be used for identifying the misalignment in the position of the micro devices on system substrate. In another case, color filter or color conversion may be adjusted based on the location of micro devices as well. In one case, some random offset may be induced in the micro device location to reduce the optical artifacts.

In one embodiment, patterns related to the micro devices may be modified (e.g electrodes coupling micro devices to a signal, functional tunable layers (e.g. color conversion or color filter), via opening in the passivation/planarization layer, backplane layers, etc.).

In one case, the position/shape of an electrode may be modified based on the position of micro devices. In another case, there can be some extension for each electrode that its position or length can be modified based on the position of the micro device.

Various embodiments in accordance with the present structures and processes provided are described below in detail.

With reference to FIG. 1A, a micro device substrate 102 is provided. An array of micro devices 104 may be developed on the micro device substrate 102. In one case, the micro-devices can be micro light emitting devices. In another case, the micro devices may be any micro device that may typically be manufactured in planar batches, including but not limited to LEDs, OLEDs, sensors, solid state devices, integrated circuits, MEMS, and/or other electronic components.

In one case, one or more planar active layers may form on a substrate. The planar active layers may comprise a first bottom conductive layer, functional layers, e.g. light-emitting, and a second top conductive layer. The micro devices may be developed by etching the planar active layers. In one case, the etching may be done all the way to the micro device substrate. In another case, the etching may be done partially on the planar layers and leaving some on a surface of the micro device substrate. Other layers may be deposited and patterned before forming or after forming the micro devices.

Figure 1B:
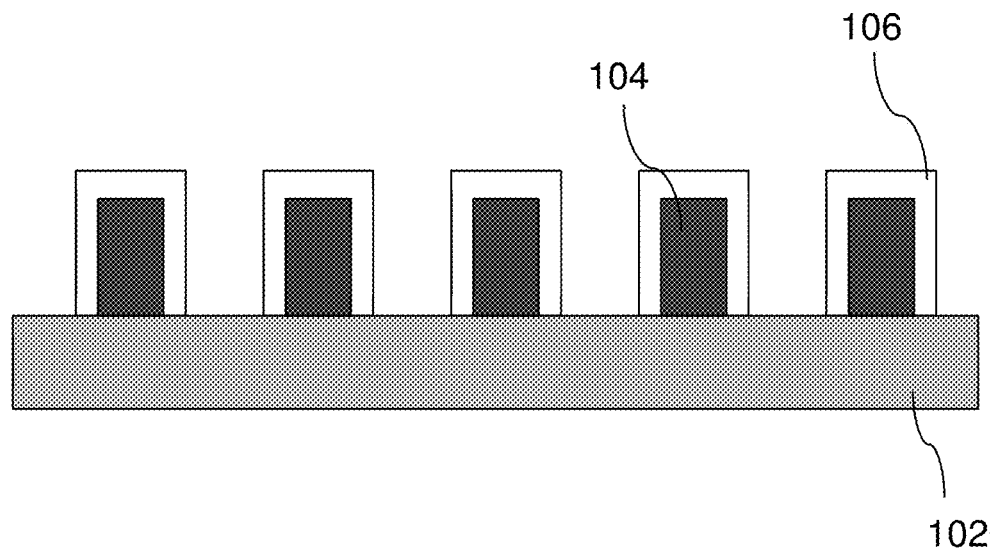
FIG. 1B shows a cross section view of the micro device array with a buffer layer, according to one embodiment of the present invention.

With reference to FIG. 1B, a buffer layer 106 may be formed on the micro device substrate 102. The buffer layer 106 may be extended over the surface of the micro device substrate 102. The buffer layer may be a conductive. The buffer layer 106 may include an electrode that can be patterned or be used as a common electrode. The buffer layer may be patterned to create an opening to the microdevice 104. The opening can provide access to the microdevice 104 for forming anchor.

Figure 1C:
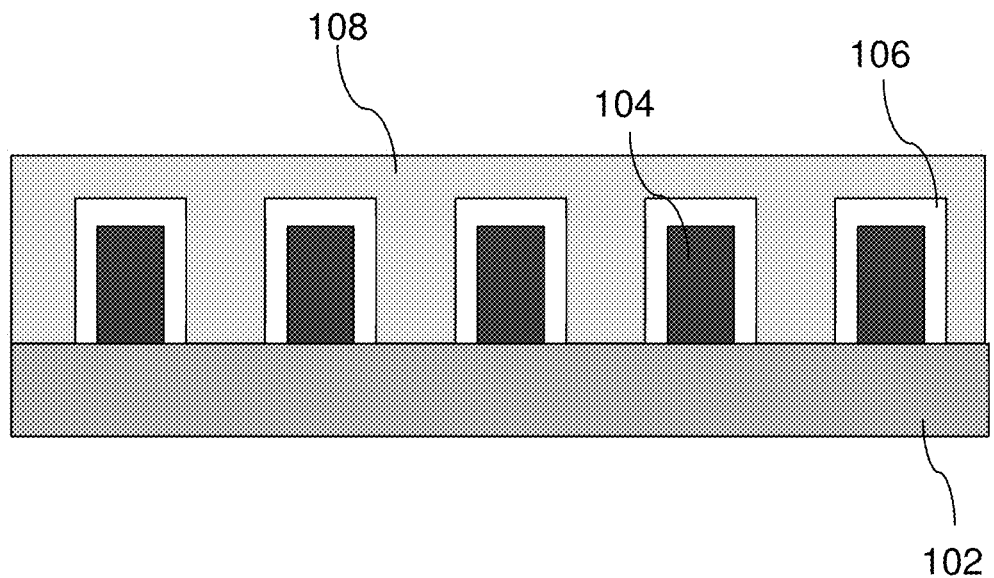
FIG. 1C shows a cross section view of micro device array, according to one embodiment of the present invention.

With reference to FIG. 1C, a planarization layer 108 may be deposited on top of the micro device substrate 102 surrounding each micro device 104 for isolation and/or protection. The planarization layer may be cured. In one case, the planarization layer may be cured through one of temperature, light or by some other sources. The planarization layer may comprise of a polymer. In one case, polyamide, SU8 or BCB may be used as polymer.

Figure 1D:
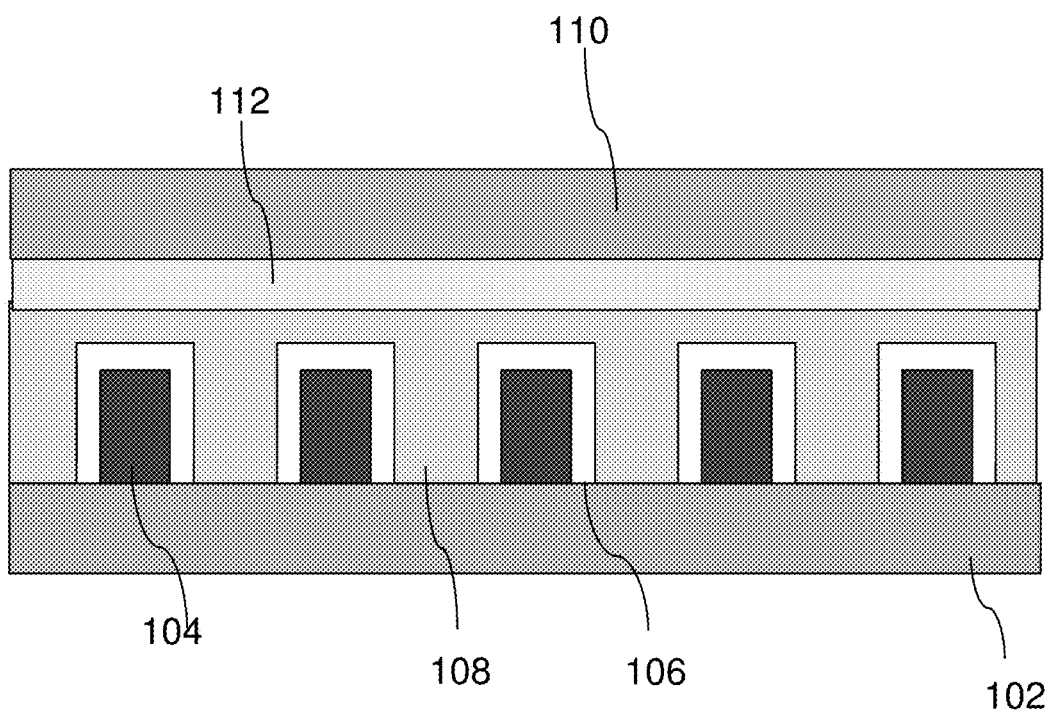
FIG. 1D shows a cross section view of the micro device array bonded to an intermediate substrate, according to one embodiment of the present invention.

With reference to FIG. 1D, in one case, bonding layer(s) 112 may be formed on the planarization layer 108. The bonding layer(s) 112 may be the same or different as the planarization layer. In another case, the bonding layer(s) may be formed on top of an intermediate substrate (cartridge) 110. Bonding layer(s) may provide one or more of different forces such as electrostatic, chemical, physical, thermal or so on. The bonding layer 112 may come in contact with planarization layer 108 and after it is in contact with the planarization layer, it gets cured by either pressure, temperature, light or other sources.

In one embodiment, after forming an intermediate substrate 110 over the bonding layer, the micro device substrate 102 may be removed. The microdevice substrate may be removed by laser or chemical liftoff.

In one case, there may be an opening in the buffer layer 106 that allows the micro devices 104 to be connected to the planarization layer 108. This connection may act as an anchor. In one case, the buffer layer may be etched to form a housing, base or anchor at least partially surrounding each micro device. After lift off, the anchor may hold the micro device to the substrate. In another case, the buffer layer may couple at least one of microdevice pads to an electrode. The electrode may be placed on top or bottom of the planarization layer.

Figure 1E:
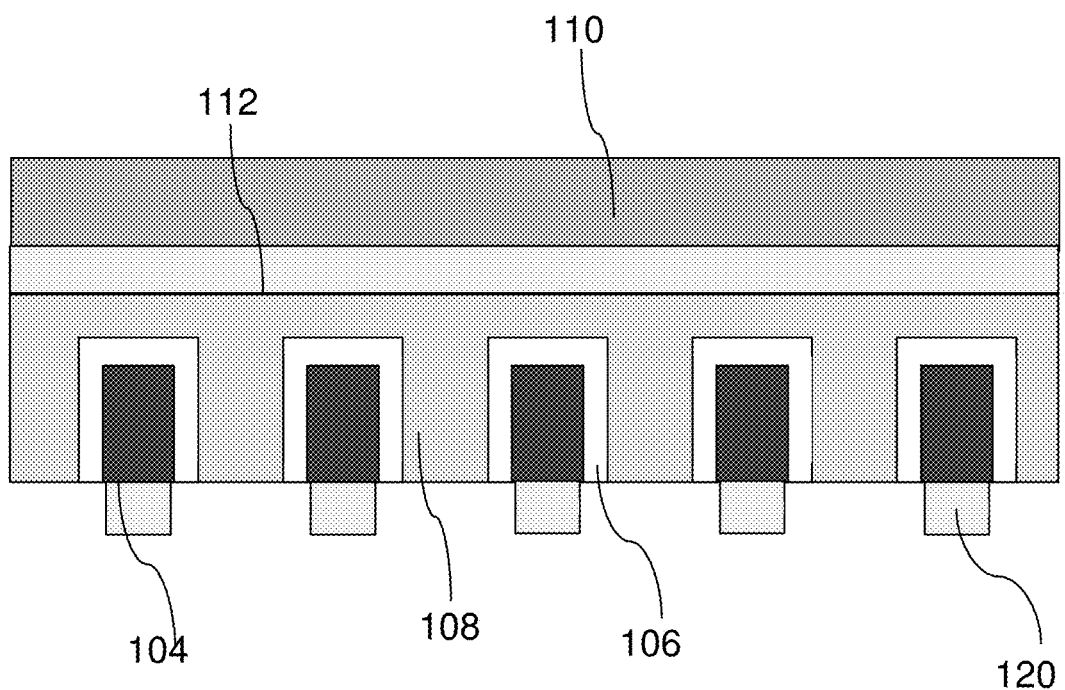
FIG. 1E shows a cross section view of the micro device array having pads, according to one embodiment of the present invention.

With reference to FIG. 1E, the micro device substrate may be removed to enable flexible system or post processing steps performed on the side of the system facing the substrate. After the substrate is removed, extra process may be done. These processes comprises one of: removing extra common layers, thinning the planarization layer and/or the microdevice. In one case, one or more pads 120 may be added to the micro devices 104. In one case, these pads may be electrically conductive. In another case, these pads may be purely for bonding to a system substrate. In one case, buffer layer 106 may be conductive.

In one embodiment, the buffer layer 106 may connect one or more micro devices to a test pad. The test pad may be used to bias the micro device and test its functionality. In one case, the test can be done at wafer/substrate level. In another case, the test may be done at the intermediate (cartridge) level. The pad may be accessible at the intermediate (cartridge) level after removing the excess layers.

In one case, if the microdevice has more than one contact at the top side, the buffer layer may be patterned to connect the contacts of at least one of the microdevices to test pads.

Figure 2:
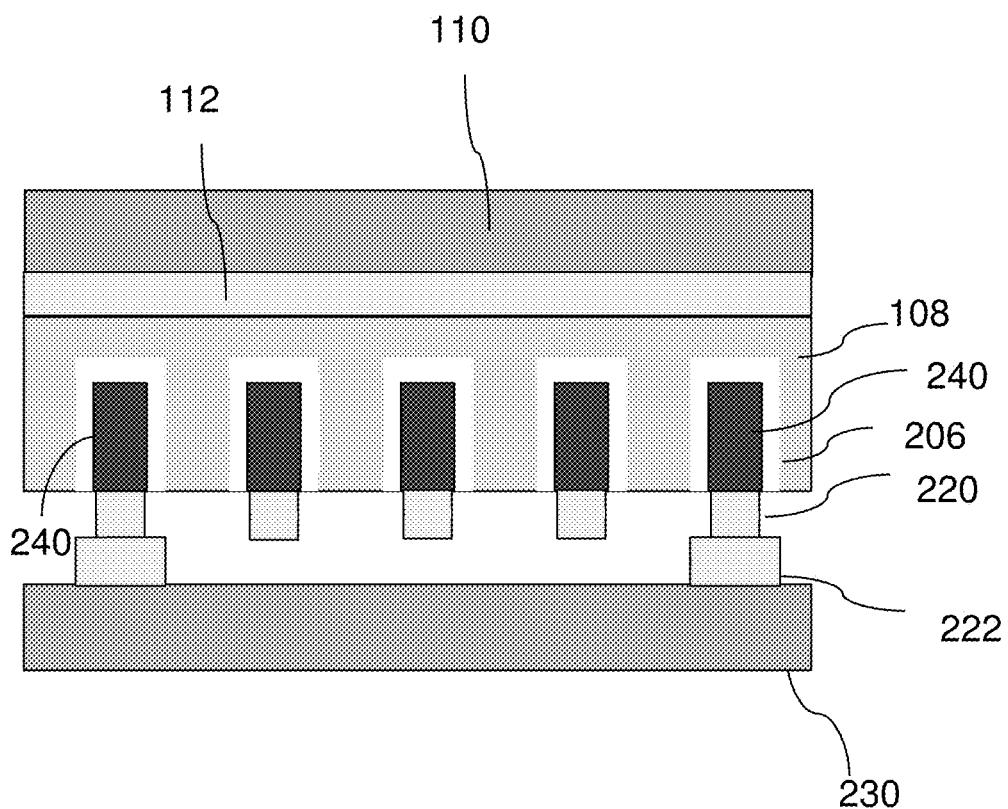
FIG. 2 shows a cross section view of a micro device array bonded to an intermediate substrate and a backplane, according to one embodiment of the present invention.

With reference to FIG. 2, a backplane 230 may be provided. In one case, the backplane may be made with a thin film transistor (TFT) process. In another case, the backplane may be made of chiplet fabricated with CMOS or other processes.

In one embodiment, the backplane may have transistors and other elements for a pixel circuit to drive the micro devices. In another embodiment, the backplane may be a substrate with no elements. One or more pads 222 may be formed on the backplane 230 for bonding the backplane to the micro devices array. In one case, the one or more pads on the backplane may be electrically conductive.

In one embodiment, the buffer layer 206 may be removed or deformed to release the micro devices. The pads 222 on the backplane or the pads 220 on micro devices may create force to pull out selected micro devices 240. In another embodiment, the buffer layer 206 or the housing may be etched back, reduced or removed. The housing may be removed from the empty LED spots.

Figure 3A:
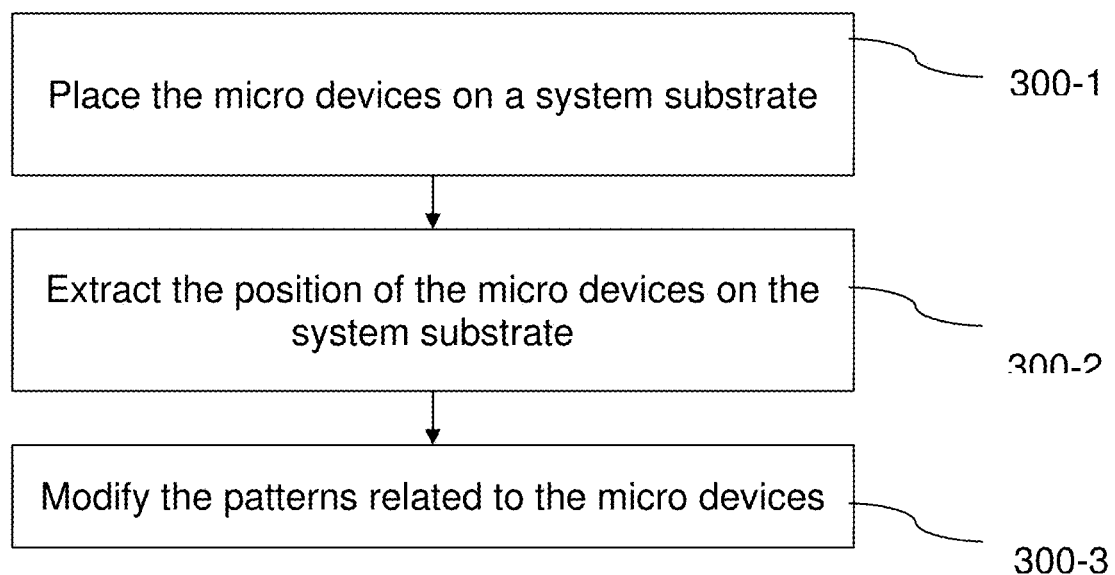
FIG. 3A shows process steps to extract the position of micro devices, according to one embodiment of the present invention.

With reference to FIG. 3A, after transferring the microdevices to the backplane, a location of the micro devices on the backplane may be detected and in case of misalignment in the transfer, the patterning for other layers may be adjusted to match the misalignment in the transfer. The process steps comprising, step 300-1, place the micro devices on a system substrate. At step 300-2, extract the position of the micro devices on the system substrate. Extracting the position of the micro device can be done by camera, surface profiler (optical, ultrasonic, electrical, etc.), or other means. At step 300-3, the patterns related to the micro devices may be modified. The patterns may include one of: electrodes coupling micro devices to a signal, functional tunable layers (e.g. color conversion or color filter), via opening in the passivation/planarization layer, backplane layers, etc. There can be some reference structure on system substrate to be used for calibrating the tool used for extracting micro device position first. or the reference can be used to find the relative position of micro devices.

In one embodiment, different means may be used to detect the micro devices location. For example, camera, probe tips, and surface profiler (optical, ultrasonic, electrical etc.) or other means may be used to detect/extract the location/position of the micro device. In another embodiment, an offset in the transfer setup may be used to identify the misalignment in the position of the microdevices on system substrate/backplane.

For example, in one case, the metalization patterning may be done to avoid short or open. In another case, color filter or color conversion may be adjusted based on the location of microdevices as well. This can reduce the tolerance required for placement of microdevices. Some random offset may also be induced in the microdevice location to reduce the optical artifacts.

Figure 3B:
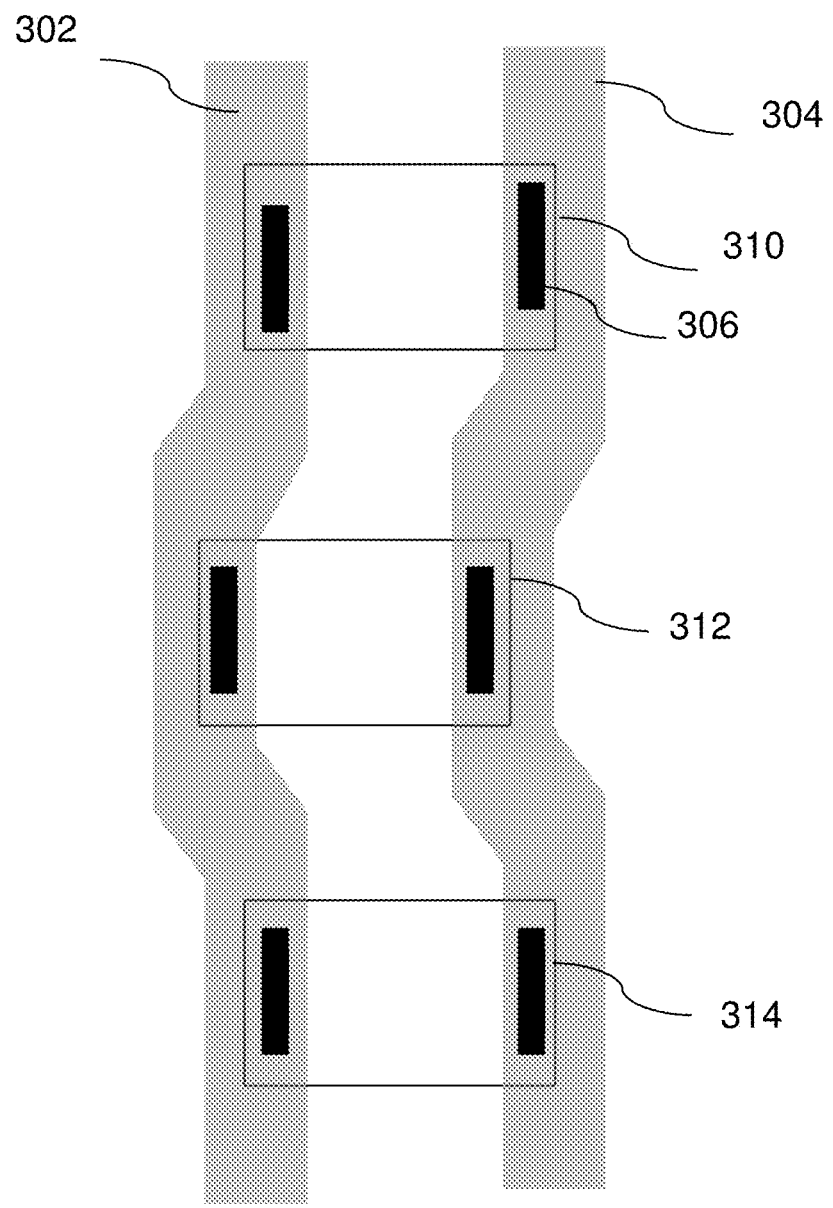
FIG. 3B shows modification in position/shape of electrode based on a position of micro devices, according to one embodiment of the present invention.

FIG. 3B shows modification in position/shape of electrode based on a position of micro devices, according to one embodiment of the present invention. One or more micro devices 310, 312 or 314 may be provided with contact pads 310. In one case, a position/shape of an electrode (302, 304) may be modified based on the position of micro devices (310, 212, 314). In another case, position/shape of the electrode may be modified based on a position of via. In another case, a position of via in planarization/passivation layer can be modified according to the micro device position.

Figure 3C:
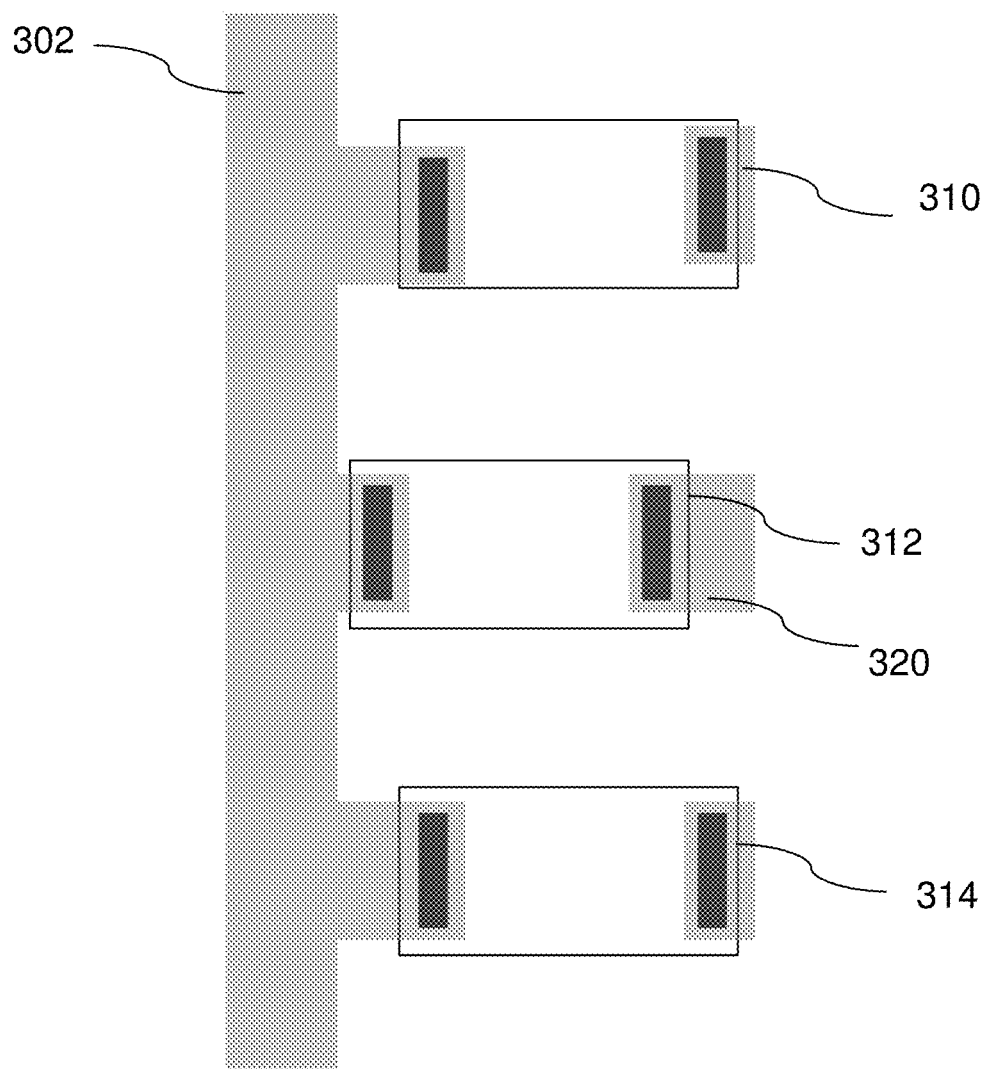
FIG. 3C shows providing extension to the electrodes, according to one embodiment of the present invention.

FIG. 3C shows providing extension to the electrodes, according to one embodiment of the present invention. In one case, the position of the electrode 302 may be modified.

Also, there can be some extension 320 for each electrode that its position or length can be modified based on the position of the micro device (310, 312 or 314). This can be used for common electrode or individual electrode.

Figure 4A:
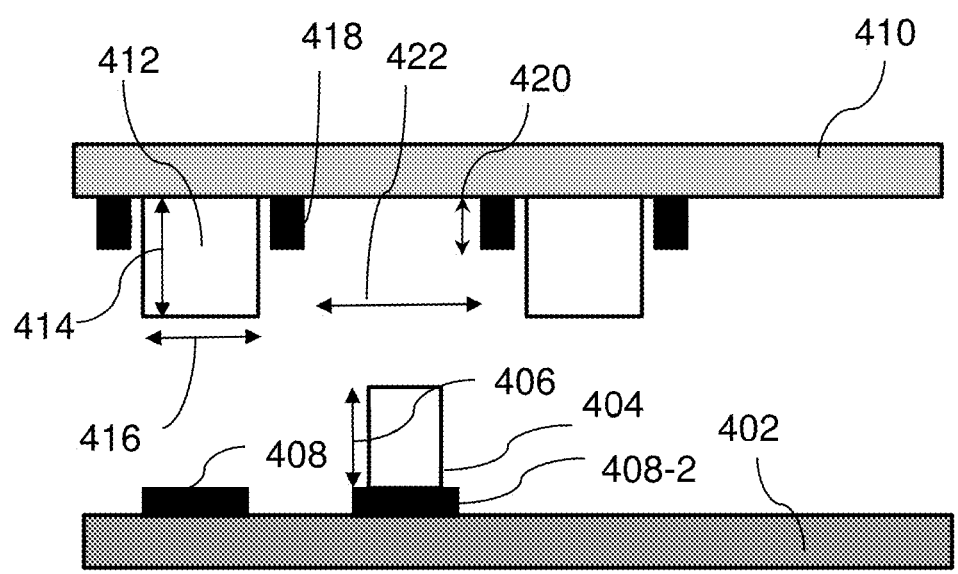
FIG. 4A shows a cross-sectional view of a system substrate and a cartridge substrate, according to another embodiment of the present invention.

FIG. 4A shows a cross-sectional view of a system substrate and a cartridge substrate, according to another embodiment of the present invention. Here, the system substrate 402 comprises a surface profile 404 which has a height difference 406 compared with a position 408 where a second micro device will be integrated. The surface profile 404 can be the first micro device that is integrated on the surface of system substrate 402. There is a cartridge substrate 410 (or a carrier substrate) having a plurality of second micro devices 412. The second micro devices 412 can have a height of 414 and a width of 416. The second micro devices 412 on the cartridge substrate 410 is surrounded partially or fully by a housing 418 with a height 420. There is at least one spacing 422 wider than the width of surface profile 404 between two of the second microdevices 412 on the cartridge substrate 410.

In one case, the width of second microdevice 412 is wider than that of the first microdevice 404. As a result, when a second micro device is removed from the cartridge substrate 410 to create spacing, the space 422 is wider than the first micro device 404. The width difference can be larger than the width of the first device and the misalignment in transferring microdevices. Therefore, when the second microdevice 412 is being integrated from the cartridge substrate 410 into the system substrate 402, there is no interference between the first micro device 404 that is already in the receiver substrate with the housing or the second microdevices in the cartridge substrate.

In another embodiment, the height 414 of the second micro device is taller than the first micro device. The height difference can be more than the sum of the height 406 of the first micro device 404 and the height 420 of the housing 418 minus the height difference between the staging 408, 408-2 for the first and second microdevice.

Figure 5A:
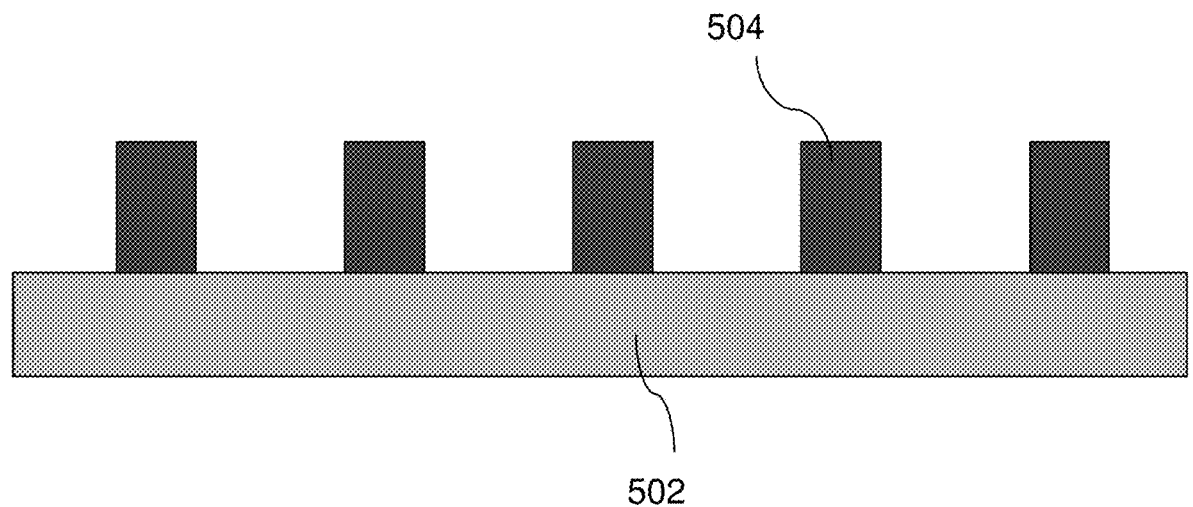
FIG. 5A shows an array of micro devices on a substrate.

With reference to FIG. 5A, a micro device substrate 502 is provided. An array of micro devices 504 may be developed on the micro device substrate 502. In one case, the micro-devices can be micro light emitting devices. In another case, the micro devices may be any micro device that may typically be manufactured in planar batches, including but not limited to LEDs, OLEDs, sensors, solid state devices, integrated circuits, MEMS, and/or other electronic components.

In one case, one or more planar active layers may form on a substrate. The planar active layers may comprise a first bottom conductive layer, functional layers, e.g. light-emitting, and a second top conductive layer. The micro devices may be developed by etching the planar active layers. In one case, the etching may be done all the way to the micro device substrate. In another case, the etching may be done partially on the planar layers and leaving some on a surface of the micro device substrate. Other layers may be deposited and patterned before forming or after forming the micro devices.

Figure 5B:
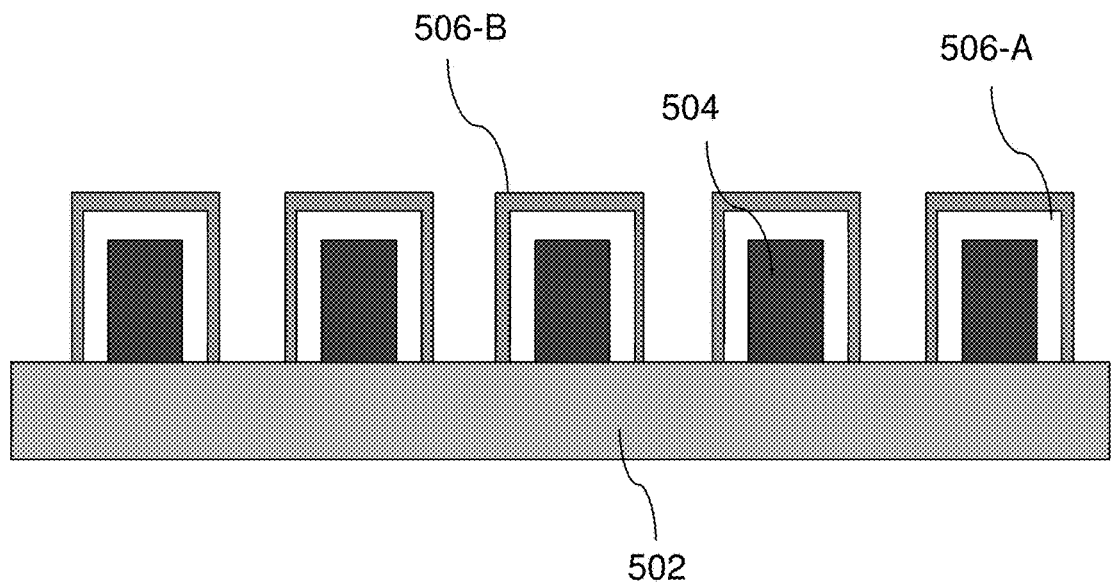
FIG. 5B shows the array of micro devices on a substrate with a buffer.

With reference to FIG. 5B, a buffer layer 506 may be formed on the micro device substrate 502. The buffer layer 506-A may be extended over the surface of the micro device substrate 502. The buffer layer may be a conductive. The buffer layer 506-A may include an electrode that can be patterned or be used as a common electrode. The buffer layer may be patterned to create an opening to the microdevice 504. The opening can provide access to the microdevice 504 for forming anchor. In this case, a protective layer 506-B is deposited on top of the buffer layer. There might be another passivation layer between buffer layer 506-A and the microdevice layer. The protective layer 506-B can be patterned to create more anchors.

Figure 5C:
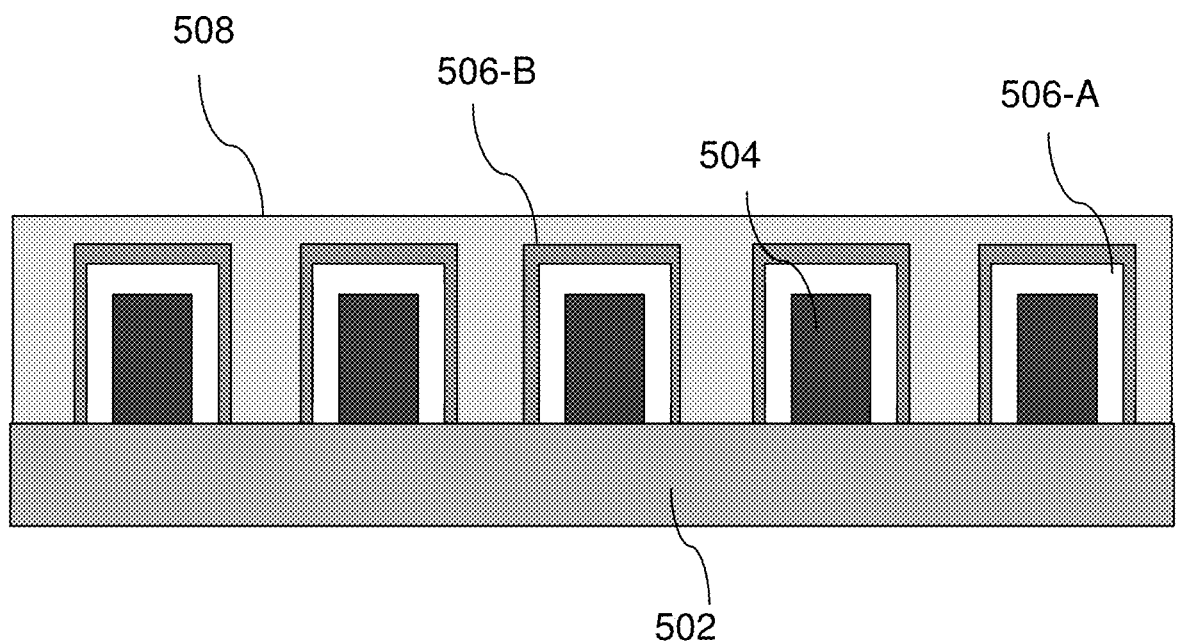
FIG. 5C shows the array of micro devices on a substrate with a buffer and a planarization layer.

With reference to FIG. 5C, a planarization layer 508 may be deposited on top of the micro device substrate 502 surrounding each micro device 504 for isolation and/or protection. The planarization layer may be cured. In one case, the planarization layer may be cured through one of temperature, light or by some other sources. The planarization layer may comprise of a polymer. In one case, polyamide, SU8 or BCB may be used as polymer.

Figure 5D:
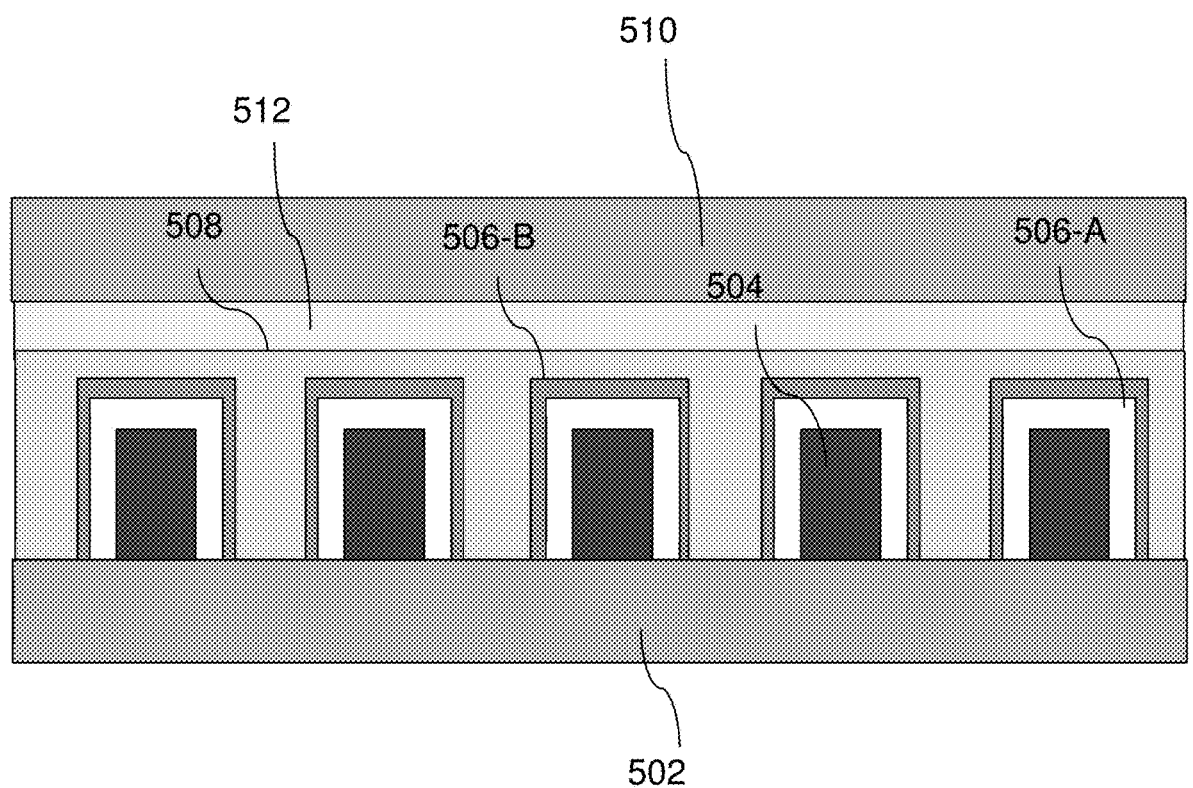
FIG. 5D shows the array of micro devices on a substrate with a buffer and a planarization layer along with bonding layer and intermediate substrate.

With reference to FIG. 5D, in one case, bonding layer(s) 512 may be formed on the planarization layer 508. The bonding layer(s) 512 may be the same or different as the planarization layer. In another case, the bonding layer(s) may be formed on top of an intermediate substrate (cartridge) 510. Bonding layer(s) may provide one or more of different forces such as electrostatic, chemical, physical, thermal or so on. The bonding layer 512 may come in contact with planarization layer 508 and after it is in contact with the planarization layer, it gets cured by either pressure, temperature, light or other sources.

In one embodiment, after forming an intermediate substrate 510 over the bonding layer, the micro device substrate 502 may be removed. The microdevice substrate may be removed by laser or chemical liftoff.

In one case, there may be an opening in the buffer layer 506-A that allows the micro devices 504 to be connected to the planarization layer 508 or to the protective layer 506-B. This connection may act as an anchor. In one case, the buffer layer may be etched to form a housing, base or anchor at least partially surrounding each micro device. After lift off, the anchor may hold the micro device to the substrate. In another case, the buffer layer may couple at least one of microdevice pads to an electrode. The electrode may be placed on top or bottom of the planarization layer.

Figure 5E:
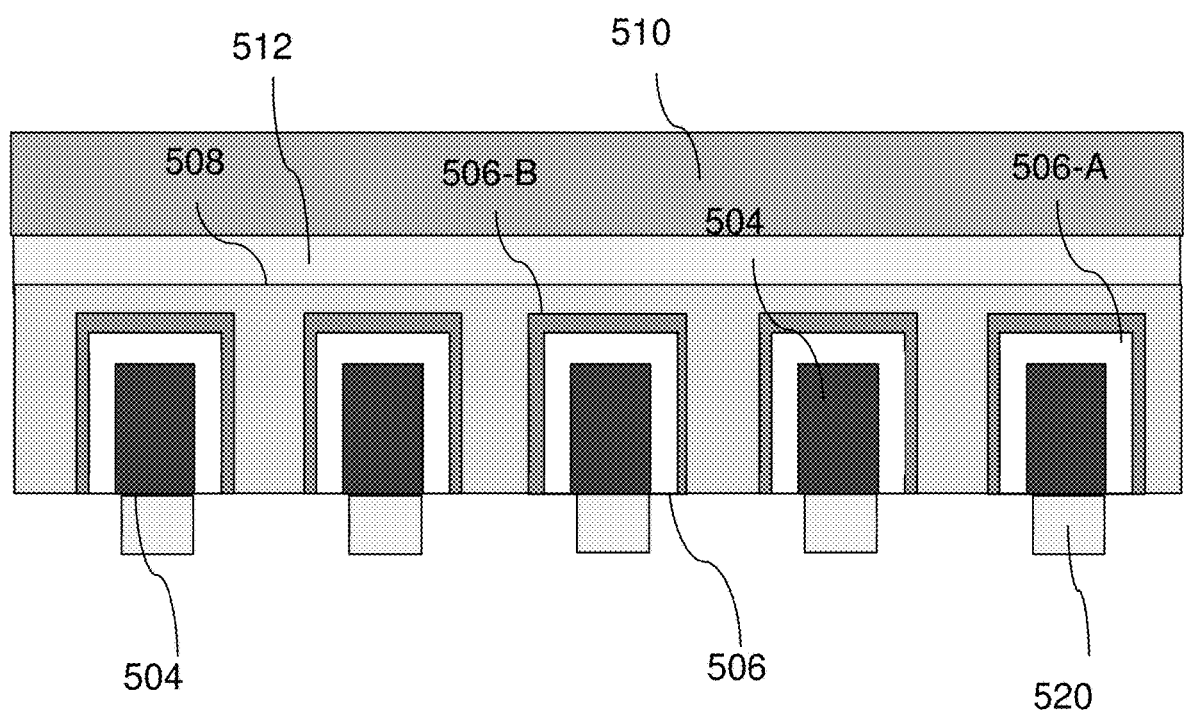
FIG. 5E shows the array of micro devices with the substrate removed.
Figure 6:
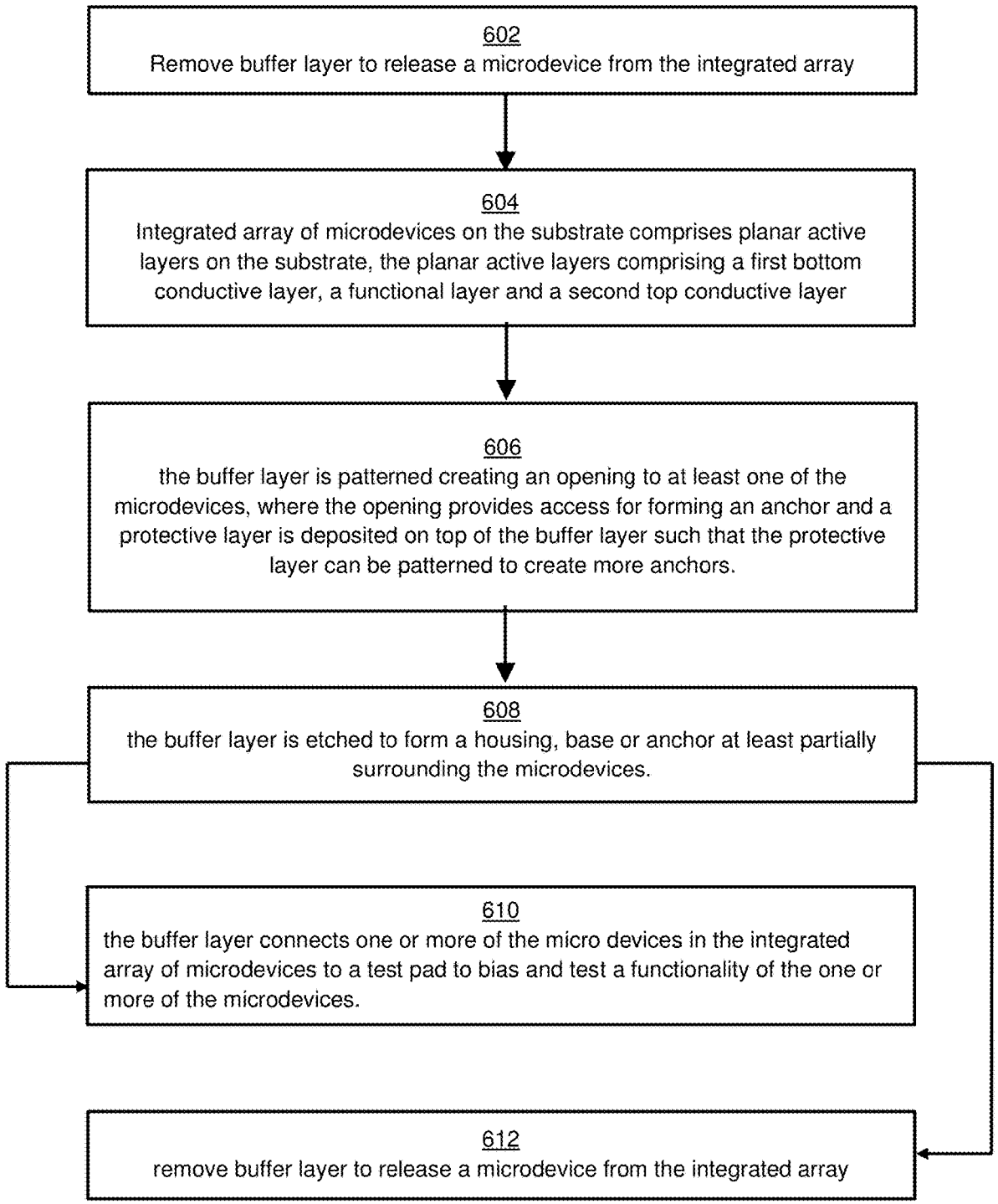
FIG. 6 shows flowchart of a method releasing microdevices from an integrated array of microdevices on a substrate.

With reference to FIG. 5E, the micro device substrate may be removed to enable flexible system or post processing steps performed on the side of the system facing the substrate. After the substrate is removed, extra process may be done. These processes comprises one of: removing extra common layers, thinning the planarization layer and/or the microdevice. In one case, one or more pads 520 may be added to the micro devices 504. In one case, these pads may be electrically conductive. In another case, these pads may be purely for bonding to a system substrate. In one case, buffer layer 506-A may be conductive. Referring now to FIG. 6 shown is a flowchart for a process 600 for releasing microdevices from an integrated array of microdevices on a substrate according to an embodiment. Starting at block 602, process 600 includes removing a buffer layer to release a microdevice from the integrated array. At block 604, process 600 includes the integrated array of microdevices on the substrate comprising planar active layers on the substrate, the planar active layers comprising a first bottom conductive layer, a functional layer and a second top conductive layer. Next at 606, process 600 includes, patterning the buffer layer for creating an opening to at least one of the microdevices, where the opening provides access for forming an anchor and a protective layer is deposited on top of the buffer layer such that the protective layer can be patterned to create more anchors. In some instances, process 600 includes step 608 including etching the buffer layer to form a housing, base or anchor at least partially surrounding the microdevices. In some instances, process 600 includes step 610 including the buffer layer connects one or more of the micro devices in the integrated array of microdevices to a test pad to bias and test a functionality of the one or more of the microdevices. In some other instances, 600 includes step 612 including removing the buffer layer to release a microdevice from the integrated array.

In one embodiment, the buffer layer 506-A or protective layer 506-B may connect one or more micro devices to a test pad. The test pad may be used to bias the micro device and test its functionality. In one case, the test can be done at wafer/substrate level. In another case, the test may be done at the intermediate (cartridge) level. The pad may be accessible at the intermediate (cartridge) level after removing the excess layers.

In one case, if the microdevice has more than one contact at the top side, the buffer layer may be patterned to connect the contacts of at least one of the microdevices to test pads.

Figure 5F:
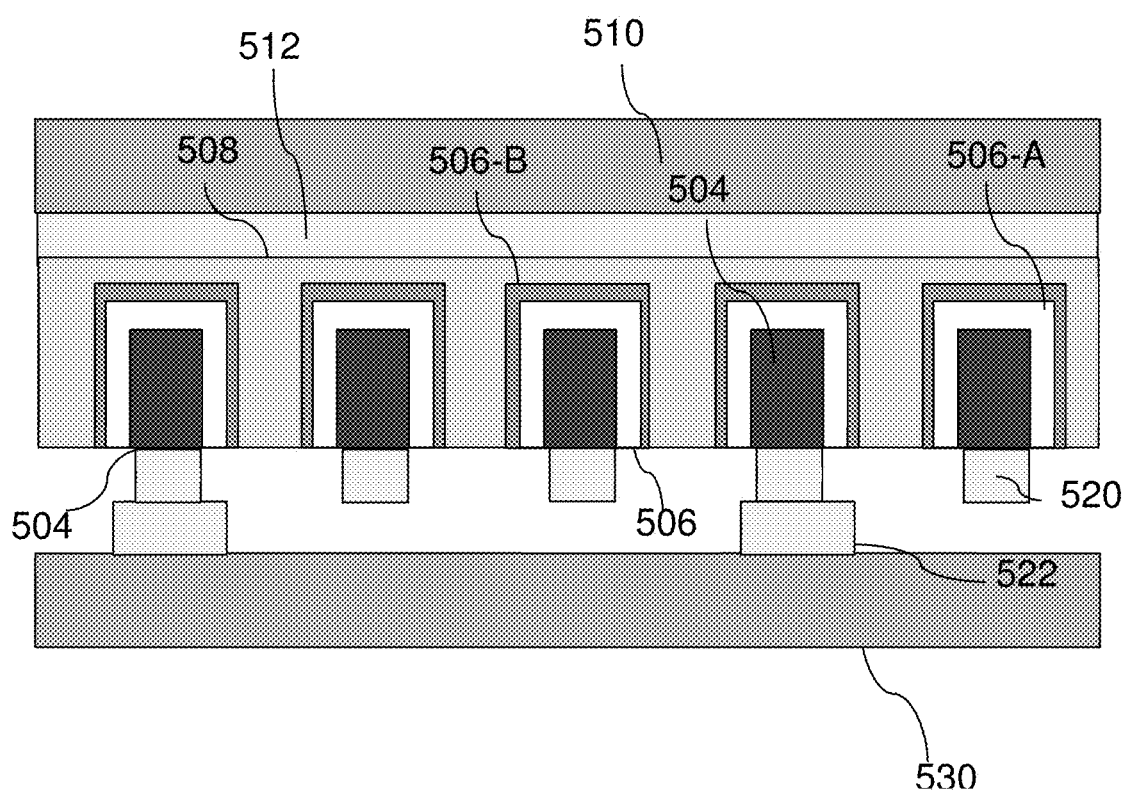
FIG. 5F shows selective release of microdevices.

With reference to FIG. 5F, a backplane 530 may be provided. In one case, the backplane may be made with a thin film transistor (TFT) process. In another case, the backplane may be made of chiplet fabricated with CMOS or other processes.

In one embodiment, the backplane may have transistors and other elements for a pixel circuit to drive the micro devices. In another embodiment, the backplane may be a substrate with no elements. One or more pads 522 may be formed on the backplane 530 for bonding the backplane to the micro devices array. In one case, the one or more pads on the backplane may be electrically conductive.

In one embodiment, the buffer layer 506-A may be removed or deformed to release the micro devices. The pads 522 on the backplane or the pads t20 on micro devices may create force to pull out selected micro devices 540. In another embodiment, the buffer layer 506-A or the housing may be etched back, reduced or removed. The housing may be removed from the empty LED spots.

According to one embodiment, there may be provided a method of integrating micro devices on a backplane comprising; providing a micro device substrate comprising one or more micro devices; bonding a selective set of the micro devices from the substrate to the backplane by connecting pads on the micro devices and corresponding pads on the backplane, leaving the bonded selective set of micro devices on the backplane by separating the micro device substrate.

According to another embodiment, the method may further comprising forming a buffer layer on or over the one or more micro devices extended over the substrate, forming a planarization layer on the buffer layer, depositing a bonding layer between the planarization layer and an intermediate substrate, curing the bonding layer after in contact with the planarization layer, removing the micro device substrate by one of: a laser or a chemical lift off, According to some embodiments, the bonding layer is cured by either one of pressure, temperature or light.

According to another embodiment, the method may further comprising forming the pads on the micro devices through the buffer layer after removal of the micro device substrate, providing the corresponding pads on the backplane, wherein pads on the micro devices and corresponding pads on the backplane are electrically conductive.

According to yet another embodiment, bonding the selective set of the micro devices from the substrate to the backplane comprising the steps of: aligning and brining the microdevices and the backplane in contact; removing the buffer layer to release the micro devices; creating a force to pull out the selected set of micro devices; and bonding the selected set of micro devices to the backplane.

According to some embodiments, planarization layer may comprises a polymer, wherein the polymer is a polyamide, SU8 or BCB.

According to other embodiments, the method may further comprising providing an opening in the buffer layer to allow the micro devices to connect to the planarization layer. The buffer layer is conductive, wherein the buffer layer connects at least one micro device to a test pad.

According to other embodiments, the method may further comprising providing an electrode either on top or bottom of the planarization layer, coupling at least one micro device to the electrode through the buffer layer, extracting position of micro devices on the backplane, extending a position of the electrode to extracting position of micro devices on the backplane, wherein the position of micro devices is extracted by one of: a camera, a probe tip, or surface profiler.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

The invention claimed is:

1. A method of releasing microdevices from an integrated array of microdevices on a substrate the method comprising:
   forming the buffer layer on the substrate extendable over a surface of the substrate;
   depositing a planarization layer on top of the substrate such that the planarization layer can be cured, wherein a bonding layer is formed on the planarization layer or on a cartridge;
   removing a buffer layer from the integrated array to release a microdevice from the array,
   wherein the integrated array of microdevices on the substrate comprises planar active layers on the substrate, the planar active layers comprising a first bottom conductive layer, a functional layer and a second top conductive layer.

2. The method of claim 1, wherein test pads on either a backplane or microdevices create a force to pull out microdevices.

3. The method of claim 2, wherein the backplane is made with a thin film transistor (TFT) process.

4. The method of claim 1, further comprising:
   developing the microdevices by etching of the planar active layers with other layers deposited before or after forming the microdevices.

5. The method of claim 1, wherein the buffer layer is conductive.

6. The method of claim 1, wherein the buffer layer includes a patternable or common electrode.

7. The method of claim 1, wherein the planarization layer comprises a polymer.

8. The method of claim 1, wherein the bonding layer provides one or more different forces and, after it comes into contact with the planarization layer, it is cured.

9. The method of claim 1, wherein, after an intermediate substrate is formed over the bonding layer, the substrate is removed by laser or chemical liftoff.

10. The method of claim 1, wherein the microdevices connect to the planarization layer or protective layer via an opening in the buffer layer, and wherein the connection provides an anchor that holds the microdevices after the chemical liftoff.

* * * * *